United States Patent
Fujii (10) Patent No.: US 8,450,912 B2
(45) Date of Patent: May 28, 2013

(54) ACTUATOR ELEMENT, METHOD OF DRIVING ACTUATOR ELEMENT, METHOD OF MANUFACTURING ACTUATOR ELEMENT, DEVICE INSPECTION METHOD AND MEMS SWITCH

(75) Inventor: Takamichi Fujii, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 205 days.

(21) Appl. No.: 12/974,121

(22) Filed: Dec. 21, 2010

(65) Prior Publication Data

US 2011/0156537 A1 Jun. 30, 2011

(30) Foreign Application Priority Data

Dec. 28, 2009 (JP) ................................. 2009-297877

(51) Int. Cl.
*H01L 41/08* (2006.01)
(52) U.S. Cl.
USPC .................................. 310/358; 262/62.9 PZ
(58) Field of Classification Search
USPC ................... 310/330–331, 324, 358
See application file for complete search history.

(56) References Cited

U.S. PATENT DOCUMENTS

| | | | |
|---|---|---|---|
| 7,230,371 B2 * | 6/2007 | Takeuchi et al. | 313/309 |
| 8,100,513 B2 * | 1/2012 | Arakawa et al. | 347/68 |
| 8,210,658 B2 * | 7/2012 | Arakawa et al. | 347/68 |
| 2006/0012940 A1 | 1/2006 | Song et al. | |
| 2008/0231667 A1 * | 9/2008 | Arakawa et al. | 347/71 |

FOREIGN PATENT DOCUMENTS

| | | |
|---|---|---|
| JP | 2006-32339 A | 2/2006 |
| JP | 2008-91167 A | 4/2008 |
| JP | 2009-9884 A | 1/2009 |
| JP | 2009-136934 A | 6/2009 |
| JP | 2009-245877 A | 10/2009 |
| WO | WO 2009/123111 A1 | 10/2009 |

* cited by examiner

*Primary Examiner* — Mark Budd
(74) *Attorney, Agent, or Firm* — Birch, Stewart, Kolasch & Birch, LLP (57) ABSTRACT

An actuator element includes: a piezoelectric body; a pair of electrodes mutually opposing to each other via the piezoelectric body; a diaphragm to which the piezoelectric body sandwiched between the pair of electrodes is bonded; and a base substrate arranged to oppose a movable part including the piezoelectric body and the diaphragm, the movable part being displaced in a direction toward the base substrate by application of a drive voltage to the pair of electrodes, wherein polarization (Pr)-electric field (E) hysteresis characteristics of the piezoelectric body are biased with respect to an electric field, and by application of a voltage in an opposite direction to the drive voltage, to the pair of electrodes, the movable part is displaced in a direction away from the base substrate.

13 Claims, 7 Drawing Sheets

RELATED ART

ACTUATOR ELEMENT, METHOD OF DRIVING ACTUATOR ELEMENT, METHOD OF MANUFACTURING ACTUATOR ELEMENT, DEVICE INSPECTION METHOD AND MEMS SWITCH

BACKGROUND OF THE INVENTION

1. Field of the Invention

The present invention relates to an actuator element using a piezoelectric thin film, and more particularly to an actuator element having a structure in which a diaphragm is displaced by piezoelectric driving, and to a method of driving such an element and a method of manufacturing such an element, and a device inspection method and a Micro Electro Mechanical System (MEMS) switch using such as actuator element.

2. Description of the Related Art

In recent years, switch elements having various structures and technology for manufacturing same have been proposed in the field of MEMS devices (see, for example, Japanese Patent Application Publication No. 2006-32339, Japanese Patent Application Publication No. 2009-136934, Japanese Patent Application Publication No. 2009-9884, Japanese Patent Application Publication No. 2009-245877 and Japanese Patent Application Publication No. 2008-91167). Japanese Patent Application Publication No. 2006-32339 proposes an rf (Radio Frequency)-MEMS switch which is driven by an electrostatic method. Japanese Patent Application Publication No. 2006-32339 discloses technology for preventing charge accumulation and a consequent sticking phenomenon (sticking of the element), by providing a semiconductor layer between electrodes. Japanese Patent Application Publication No. 2009-136934 proposes a method of manufacturing a MEMS device including a step of removing a sacrificial layer using an electrical corrosion reaction employing aqua regia, from the viewpoint of preventing sticking as a result of residual etching solution during manufacture.

Japanese Patent Application Publication No. 2009-9884 proposes a method of manufacture in which a sacrificial layer provided between a movable electrode and an attracting element is divided into a first sacrificial layer and a second sacrificial layer made of materials of respectively different types, in order to resolve a problem of sticking which occurs in a process for manufacturing a MEMS switch which is driven by an electrostatic force method. Japanese Patent Application Publication No. 2009-245877 discloses a composition in which an insulating film for preventing sticking is formed on the front surface of a base substrate on which a fixed electrode is formed.

Japanese Patent Application Publication No. 2008-91167 proposes a method of resolving problems of sticking by using a c-axis oriented film of aluminum nitride (AlN) or zinc oxide (ZnO) instead of using a lead material in the piezoelectric film.

Figure 6:
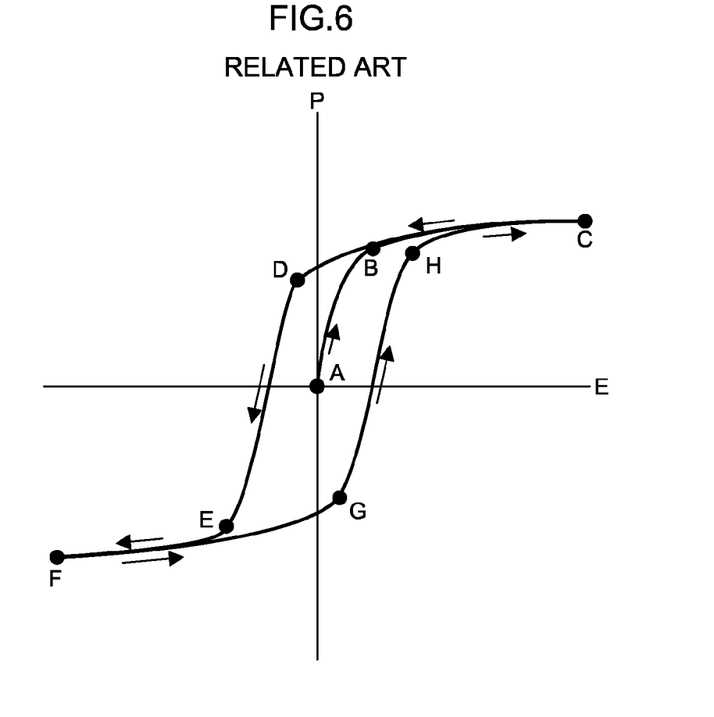
FIG. 6 is a diagram showing Pr-E hysteresis characteristics of a related-art piezoelectric body (PZT type) (cited from FIG. 4 of Japanese Patent Application Publication No. 2008-91167)
Figure 7:
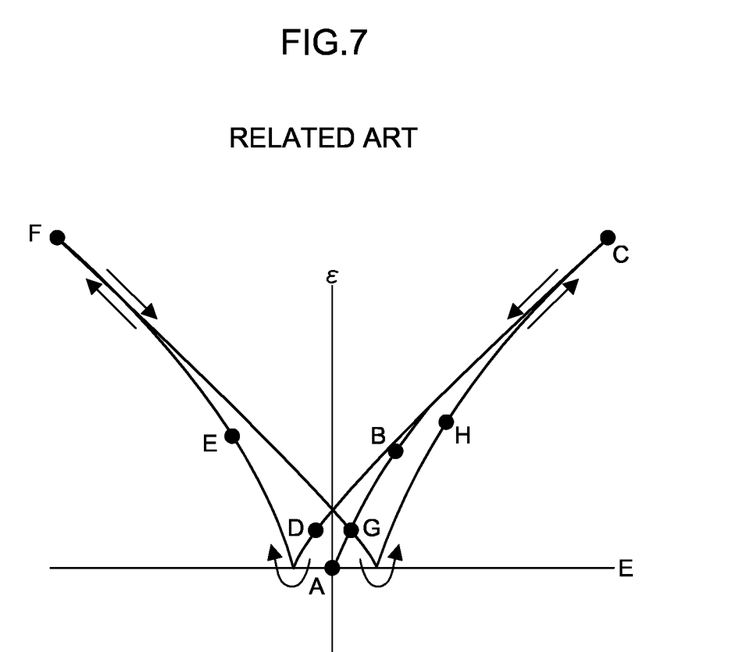
FIG. 7 is a diagram showing the relationship between distortion and applied electric field in a related-art piezoelectric body (PZT type) (cited from FIG. 5 of Japanese Patent Application Publication No. 2008-91167).

If an actuator using a piezoelectric film made of a lead material (PZT material) is described on the basis of the description in Japanese Patent Application Publication No. 2008-91167, then in the related art, such an actuator has been driven using a piezoelectric body having characteristics such as those shown in FIG. 6 and FIG. 7. FIG. 6 is a diagram showing the relationship between the electric field E applied to a ferroelectric film and the polarization Pr, which is known as the Pr-E hysteresis curve. FIG. 7 is a diagram showing the relationship between the distortion (electrostriction) c produced in a ferroelectric body and the applied electric field E. These diagrams are cited from FIG. 4 and FIG. 5 of Japanese Patent Application Publication No. 2008-91167.

In the case of a switch element (for example, an element having a cantilever structure) which uses a piezoelectric body having the characteristics shown in these drawings, the displacement in the opposite direction is not obtained even if a voltage in the opposite direction is applied to the piezoelectric body, and a drive force in a separating direction which resolves the issue of sticking is not obtained.

In other words, the hysteresis characteristics in FIG. 6 have left-right symmetry with respect to positive and negative electric fields. Furthermore, in FIG. 7, if the sign of the applied voltage (the direction of the electric field) is changed, then although the distortion (displacement) acts slightly in the opposite direction, effectively, the distortion (displacement) only acts in the same direction even if the sign of the applied voltage (direction of the electric field) is changed. Consequently, sticking is not prevented (resolved), even by driving with application of an opposite voltage.

In this respect, Japanese Patent Application Publication No. 2008-91167 discloses using a piezoelectric body made of AlN or ZnO instead of a lead-based (PZT based) piezoelectric body, but the piezoelectric constant of AlN or ZnO is 1/10 or less of the piezoelectric constant of the PZT based, and therefore the force produced by driving the actuator is very weak. Therefore, the method described in Japanese Patent Application Publication No. 2008-91167 is not sufficient to prevent sticking.

SUMMARY OF THE INVENTION

The present invention has been contrived in view of these circumstances, an object thereof being to provide a composition of an actuator element capable of effectively preventing sticking (adherence or fixing of an element), and a method of driving same, as well as a method of manufacturing such an element, a device inspection method and a MEMS switch using such actuator element.

The following modes of the invention are proposed in order to achieve an aforementioned object.

In order to attain an object described above, one aspect of the present invention is directed to an actuator element comprising: a piezoelectric body; a pair of electrodes mutually opposing to each other via the piezoelectric body; a diaphragm to which the piezoelectric body sandwiched between the pair of electrodes is bonded; and a base substrate arranged to oppose a movable part including the piezoelectric body and the diaphragm, the movable part being displaced in a direction toward the base substrate by application of a drive voltage to the pair of electrodes, wherein polarization (Pr)-electric field (E) hysteresis characteristics of the piezoelectric body are biased with respect to an electric field, and by application of a voltage in an opposite direction to the drive voltage, to the pair of electrodes, the movable part is displaced in a direction away from the base substrate.

According to this aspect of the invention, it is possible to drive a movable part in a direction pulling and separating from a base substrate by applying a voltage in the opposite direction to the drive voltage when driving the movable part in a direction toward the base substrate. Sticking of the movable part to the base substrate can be prevented, and the sticking of the element can be resolved by means of the drive force in this pulling and separating direction. If piezoelectric driving is performed by application of a voltage in the opposite direction, from a state where the movable part is displaced toward the base substrate side, then in addition to the force (spring force) which seeks to return the diaphragm to its original position (reference position), a drive force is also applied in the separating direction by means of piezoelectric driving, and therefore it is possible to obtain a strong separating force.

Desirably, of a coercive electric field on a positive electric field side and a coercive electric field on a negative field side in the Pr-E hysteresis characteristics, when a coercive electric field in an electric field direction at a time of driving by application of the drive voltage is represented by Ec_a and a coercive electric field in an electric field direction at a time of the movable part being displaced in the direction away from the base substrate by application of the voltage in the opposite direction is represented by Ec_b, then |Ec_b|>|Ec_a| is established.

Desirably, |Ec_b|>2|Ec_a|, and more desirably, |Ec_b|>5|Ec_a|. The greater the difference between |Ec_b| and |Ec_a| (the greater the bias), the more desirable from the viewpoint of raising the voltage that can be applied when driving to prevent sticking is performed.

Desirably, at the time of the movable part being displaced in the direction away from the base substrate, a voltage obtained by switching a polarity of the drive voltage is applied in such a manner that the movable part is displaced by utilizing extension, in the d31 direction, of the piezoelectric body.

In this mode, when the piezoelectric body bonded to the diaphragm elongates in the d31 direction, the movable part including this diaphragm is displaced in a direction away from the base substrate.

Desirably, the drive voltage applied when driving to displace the movable part in the direction toward the base substrate is performed produces an electric field not less than the coercive electric field |Ec_a| of the piezoelectric body, and the voltage applied when the movable part is displaced in the direction away from the base substrate produces an electric field not greater than the coercive electric field |Ec_b| of the piezoelectric body.

From a practical viewpoint, the applied electric field created by the voltage applied when driving to prevent sticking is performed is desirably equal to or greater than 10% of the coercive electric field |Ec_b|, and desirably, equal to or less than 80% of the coercive electric field |Ec_b|. More desirably, the applied electric field is 30% or greater and 80% or less of the coercive electric field |Ec_b|.

Desirably, of the pair of electrodes, defining the electrode on a base substrate side as a lower electrode and defining the electrode on an opposite side thereto as an upper electrode, a direction of the voltage applied to the pair of electrodes at a time of the movable part being displaced in the direction away from the base substrate is determined in such a manner that an electric field in a direction from the lower electrode toward the upper electrode is produced.

According to this aspect of the invention, in normal driving of the actuator (driving the movable part in a direction toward the base substrate), an electric field is applied in a direction from the upper electrode toward the lower electrode, and when driving to prevent sticking is performed, an electric field is applied in the opposite direction to this.

Therefore, it is possible to apply a positive voltage to the upper electrode in normal driving, and it is possible to use a general drive circuit (driver) for positive voltage driving, for the normal driving operation.

Desirably, voltage-displacement hysteresis characteristics representing a relationship between a voltage applied to the piezoelectric body and a displacement of same include a linear region showing a substantially proportional relationship in a continuous range extending from a negative voltage side to a positive voltage side, and a direction of the displacement reverses in the continuous linear region.

A piezoelectric body having these characteristics has a region where the displacement changes linearly even if the direction of the applied electric field is reversed, and therefore is desirable for driving in the opposite direction.

Desirably, the piezoelectric body is formed of one type or a plurality of types of perovskite oxide represented by General Formula (P-1), $Pb_a(Zr_{b1}Ti_{b2}X_{b3})O_3$ (P-1), where, X represents at least one type of metal element selected from the V and VI groups; a>0, b1>0, b2>0, and b3≧0 are established; a case where a≧1.0 and b1+b2+b3=1.0 are established is standard, while these figures may deviate from 1.0 within a range allowing a perovskite structure to be obtained; and the piezoelectric body may include unavoidable impurities.

According to this aspect of the invention, the piezoelectric film has piezoelectric characteristics in which the polarity of the coercive electric field having a smaller absolute value is negative and the Pr-E hysteresis is biased toward the positive field side.

In order to attain an object described above, another aspect of the present invention is directed to a method of driving any one of the actuator elements above wherein, of a coercive electric field on a positive electric field side and a coercive electric field on a negative field side in the Pr-E hysteresis characteristics, when a coercive electric field in an electric field direction at a time of driving by application of the drive voltage is represented by Ec_a and a coercive electric field in an electric field direction at a time of the movable part being displaced in the direction away from the base substrate by application of the voltage in the opposite direction is represented by Ec_b, the method comprising the steps of: applying the drive voltage to produce the electric field not less than the coercive electric field |Ec_a| of the piezoelectric body, when the movable part is driven in the direction toward the base substrate; and applying the voltage to produce the electric field not greater than the coercive electric field |Ec_b| of the piezoelectric body, when the movable part is displaced in the direction away from the base substrate.

As described above, the applied electric field when driving to prevent sticking is desirably equal to or less than 80% of the coercive electric field |Ec_b|, and more desirably, equal to or greater than 30% and equal to or less than 80% of the coercive electric field |Ec_b|.

In order to attain an object described above, another aspect of the present invention is directed to a device inspection method comprising the step of, when a device inspection of any one of the actuator elements above is carried out, applying the voltage in the opposite direction to the drive voltage in such a manner that the movable part is displaced in the direction away from the base substrate.

For example, in an element which is problematic in that sticking occurs in an aging test (inspection before shipment), it is possible to resolve (eradicate) sticking by the driving for preventing sticking as described above, and hence a shippable element can be obtained. Consequently, production yield is improved.

In order to attain an object described above, another aspect of the present invention is directed to a MEMS switch comprising any one of the actuator elements above, wherein: a fixed electrode is provided on the base substrate; a movable electrode which makes contact with and separates from the fixed electrode is provided on a portion of the movable part; and a distance between the fixed electrode and the movable electrode is not greater than 20 μm.

The function for preventing sticking in the actuator elements described above is especially effective when the separation distance between the base substrate and the movable part is small. This is desirable in a MEMS switch in which the distance between the switching contacts is 20 μm or less, as in this mode. Desirably, the function is effective in a switch element having an electrode separation distance of 10 μm or less, and more desirably 5 μm or less.

This aspect of the invention can be applied to an rf-MEMS switch which is a high-frequency-range low-loss switching element. An rf-MEMS switch is an element in which the switch structure is manufactured by MEMS technology, and connection (ON) and opening (OFF) of the contacts are performed by mechanical displacement of an actuator section.

In order to attain an object described above, another aspect of the present invention is directed to a method of manufacturing any one of the actuator elements, comprising a wet etching step or cleaning step in which a liquid can infiltrate between the movable part and the base substrate.

The application of the actuator elements described above is not limited to a switch element, of which the aforementioned rf-MEMS switch is a typical example, and various application examples, such as an optical modulating element, are also possible. This aspect of the invention can be applied to a method of manufacturing these devices of various types.

Liquid remaining in the device after the wet etching step or the cleaning step can be a cause of sticking. In this respect, sticking can be resolved by driving for preventing sticking according to this aspect of the present invention, and therefore production yield can be improved.

In order to attain an object described above, another aspect of the present invention is directed to a method of manufacturing any one of the actuator elements, comprising a bonding step of bonding together at least two silicon wafers including a first silicon (Si) wafer that is to be the base substrate and a second silicon (Si) wafer on which a film of the piezoelectric body is formed, wherein the film of the piezoelectric body is formed on the second silicon wafer before the bonding step, and the second silicon wafer after forming this film is bonded to the first silicon wafer.

According to this method of manufacture, it is possible to manufacture a desired device readily.

According to the present invention, it is possible to prevent sticking of an actuator element in an effective manner. Furthermore, it is also possible to achieve improvement of the production yield of elements.

BRIEF DESCRIPTION OF THE DRAWINGS

A preferred embodiment of this invention as well as other objects and benefits thereof, will be explained in the following with reference to the accompanying drawings, in which like reference characters designate the same or similar parts throughout the figures and wherein.

DESCRIPTION OF THE PREFERRED EMBODIMENTS

Below, preferred embodiments of the present invention are described in detail with respect to the accompanying drawings.

Material of the Piezoelectric Body

Firstly, the piezoelectric material used in an embodiment of the present invention will be described. The piezoelectric body used in the present embodiment is based on lead titanate zirconate (Pb(Zr,Ti)$O_3$, commonly known as "PZT"). In PZT, both Zr and Ti are tetravalent ions, and from PbTi$O_3$ to PbZr$O_3$, all concentration ratios for Ti:Zr can be obtained. Of these, particularly favorable piezoelectric characteristics are achieved with a composition having a Zr:Ti ratio of 52:48 or 53:47, which are compositions midway between a square crystal of a PbTi$O_3$ crystal system and a rhombohedron of a PbZr$O_3$ crystal system, and these characteristics are used in a piezoelectric body for an actuator. This composition is called an MPB composition.

Modified PZT is formed by adding a trace amount of ions having higher valence than tetravalent, such as $Nb^{5+}$, for instance, to true PZT which does not have any added dopant, in such a manner that the piezoelectric characteristics are improved. The PZT used in the present embodiment can be doped with approximately 10% or more of Nb, thereby obtaining high-performance PZT (modified PZT). For example, high piezoelectric characteristics of d31=200 to 300 pm/V are obtained.

Figure 1:
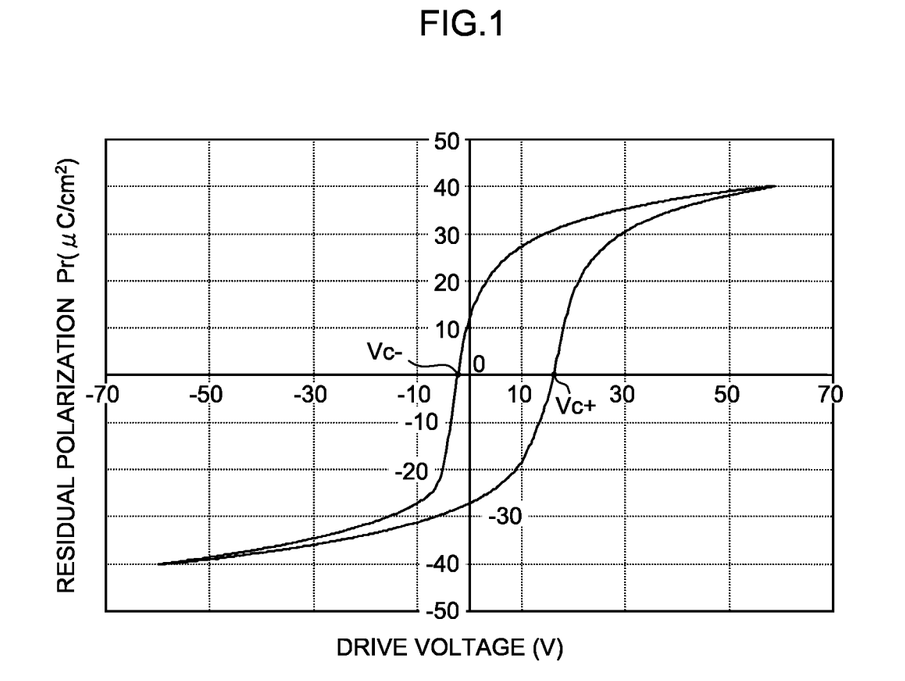
FIG. 1 is a diagram showing Pr-E hysteresis characteristics of a piezoelectric film (film thickness 4 μm) used in an example of an embodiment of the present invention.

FIG. 1 shows the Pr-E hysteresis characteristics of a piezoelectric film (film thickness 4 μm) used in the present embodiment. Here, a modified PZT film doped with Nb is used. The horizontal axis in FIG. 1 represents the "drive voltage" (unit: Volts [V]), and the electric field is obtained by dividing the voltage by the film thickness. The coercive electric field is a point on the P-E hysteresis curve where the residual polarization becomes zero, and the coercive electric field of the piezoelectric film in the present embodiment is approximately 35 kV/cm on the positive field side (Ec+) and approximately 7.5 kV/cm on the negative field side (Ec−). In FIG. 1, Vc+ represents the voltage (the product of the coercive electric field (Ec+) and the film thickness) corresponding to the coercive electric field (Ec+) on the positive field side, and Vc− represents the voltage (the product of the coercive electric field (Ec−) and the film thickness) corresponding to the coercive electric field (Ec−) on the negative field side.

As shown in FIG. 6, the Pr-E hysteresis of a conventional general piezoelectric body is substantially symmetrical with respect to the y axis which indicates the polarization value, and the coercive electric field Ec1 on the negative field side and the coercive electric field Ec2 on the positive field side are substantially equal (|Ec1|≈Ec2).

On the other hand, the PZTN film used in the present embodiment is formed by vapor phase deposition, such as sputtering, and the Pr-E hysteresis of the PZTN film is biased toward the positive field side, in other words, is asymmetrical with respect to the y axis, as shown in FIG. 1. The absolute value of the coercive electric field Ec− on the negative field side (which corresponds to "Ec_a") and the absolute value of the coercive electric field Ec+ on the positive field side (which corresponds to "Ec_b") are mutually different, and have the relationship: |Ec+|>|Ec|. Concerning a piezoelectric film having asymmetrical P-E hysteresis biased toward the positive field side in this way, when a positive electric field is applied, it is difficult to achieve polarization because the coercive electric field Ec+ is large, and when a negative electric field is applied, polarization can be achieved readily because the absolute value of the coercive electric field Ec− is small.

In other words, by driving by applying an electric field of the polarity on the side having the lower absolute value of the coercive electric field (in this case, negative driving), it is possible to obtain a large piezoelectric capacity.

The example described in the present embodiment is a piezoelectric body having Pr-E hysteresis biased toward the positive field side, but it is possible to obtain similar action and beneficial effects in a piezoelectric body having Pr-E hysteresis biased toward the negative field side, except that the signs of the values will be different.

Figure 2:
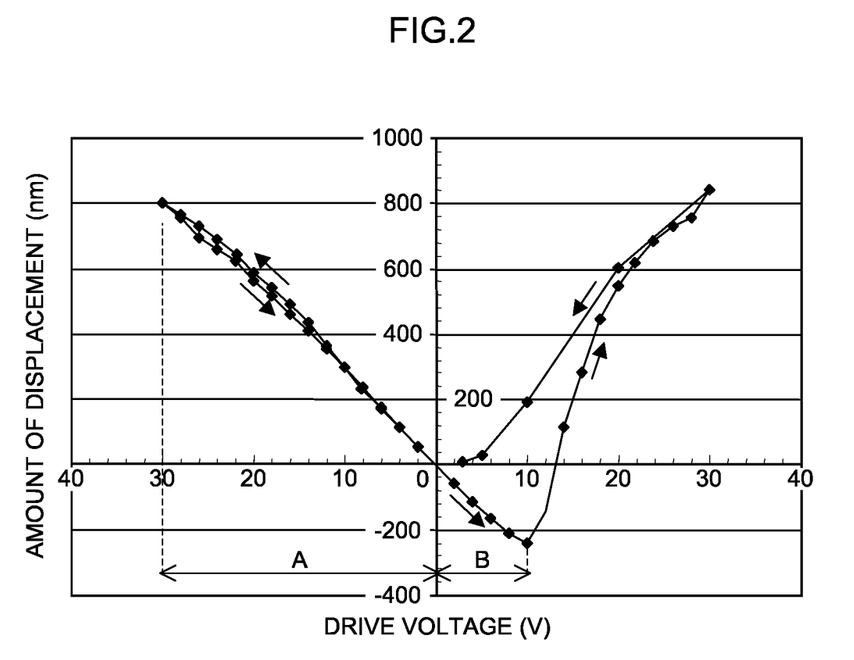
FIG. 2 is a diagram showing a relationship between drive voltage and displacement (electric field-displacement hysteresis characteristics) when a piezoelectric actuator including a piezoelectric film having the characteristics in FIG. 1 is driven.

FIG. 2 is a diagram showing the relationship between the drive voltage and the displacement upon driving a piezoelectric actuator including a piezoelectric film having the Pr-E hysteresis characteristics shown in FIG. 1. In FIG. 2, the "electric field-hysteresis characteristics" obtained by driving a piezoelectric actuator (see FIG. 3) manufactured according to the manufacturing example described below are shown. Here, the positive and negative signs of the drive voltage are defined by taking the lower electrode (the Ti/Ir electrode layer in FIG. 3) as the reference potential (ground). The state of polarization of the piezoelectric film in the piezoelectric actuator when not being driven is indicated by + on the upper electrode side and by − on the lower electrode side (i.e. the polarization vector is in the upward direction). Moreover, with regard to the amount of displacement, a displacement of the diaphragm (the Si layer less than 5 μm thick and the $SiO_2$ layer 0.3 μm thick in FIG. 3) in the downward protruding direction is defined as displacement in the "+ direction" and an amount of displacement of the diaphragm in the upward protruding direction is defined as displacement in the "− direction".

Looking in particular at a case where a negative voltage is applied as a drive voltage, as the absolute value of the negative voltage increases from 0 V (the negative field side on the left-hand side in the drawings), the amount of displacement progressively increases in a substantially linear relationship (directly proportional relationship) in accordance with the increase in the absolute value of the applied voltage. Here, the amount of displacement of the diaphragm in the downward protruding direction is taken as an amount of displacement in the "+ direction". Furthermore, conversely, as the absolute value of the negative voltage applied becomes gradually smaller, the amount of displacement progressively declines in a similar directly proportional relationship to the above, in accordance with the decrease in the absolute value of the applied voltage. As shown in the drawings, on the negative field side, there is little hysteresis and linearity is high (the region indicated by reference numeral "A" in the drawings). In FIG. 1, the error in linearity due to hysteresis is 1% or less.

Moreover, even if the voltage passes beyond 0 V from the negative voltage and switches to a positive voltage, there is a still a linear region over a certain range (the region indicated by reference numeral "B" in the drawings). In other words, on the positive field side, in the drive voltage range of 0 to approximately 10 V, an amount of displacement in the opposite direction is obtained in substantially direct proportion to the magnitude of the applied voltage (electric field). In this way, there is a linear region in which displacement in the opposite direction (the upwardly protruding direction) is obtained when a positive voltage is applied.

The linear region on the negative field side (reference symbol A in FIG. 2) and the linear region on the positive field side (reference symbol B in FIG. 2), which are described previously, are continuous with each other, and hence a linear region (a range of region A plus region B) is formed in which a substantially direct proportional relationship is obtained in a continuous range spanning both the negative voltage side and the positive voltage side. Since there is a linear region (region indicated by reference numeral B) on the positive field side which is continuous from the linear region (reference numeral A) on the negative field side in this way, the piezoelectric actuator of the present embodiment is capable of driving which causes displacement in an opposite direction (+ direction) due to application of voltage of the opposite sign.

Figure 3:
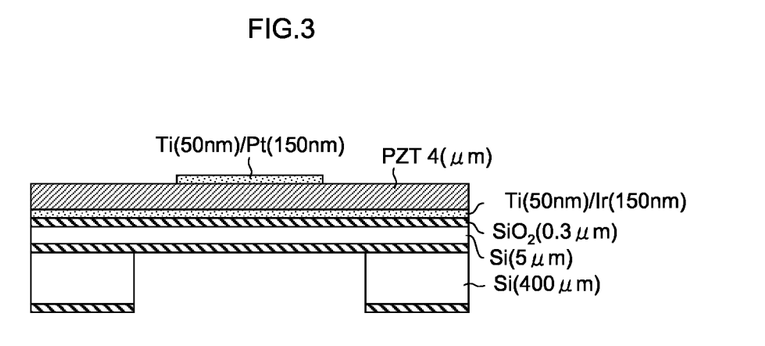
FIG. 3 is a schematic drawing of a piezoelectric actuator of which the piezoelectric characteristics in FIG. 2 were investigated.

Example of Manufacture of Piezoelectric Actuator in FIG. 3

Here, a method of manufacturing a piezoelectric actuator (FIG. 3) which was used for evaluating the piezoelectric characteristics shown in FIG. 1 and FIG. 2 will be described. First, a substrate with an electrode was prepared by successively layering a 150 nm-thick Ir lower electrode via a Ti adhesive layer, by sputtering, onto an SOI (Silicon On Insulator) substrate in which a diaphragm structure was formed. Thereupon, a Nb-doped PZT film (Nb-PZT film) was formed to a thickness of 4 microns using a $Pb_{1.3}Zr_{0.43}Ti_{0.44}Nb_{0.13}O_3$ sintered body as a target, in a mixed $Ar/O_2$ atmosphere ($O_2$ volume fraction of 1.0%) at the degree of vacuum 0.5 Pa, film forming temperature 525° C., input power 500 W, and substrate/target distance 60 mm.

In this case, the film was deposited with the substrate in a floating state and an earth provided at a position distant from the substrate that was not located between the target and the substrate. The composition of the film thus obtained was analyzed by XRF and found to be $Pb_{1.03}Zr_{0.43}T_{0.44}Nb_{0.13}O_3$.

Thereupon, an upper electrode of Pt was formed by sputtering via a Ti adhesive layer on the Nb-PZT film, and was patterned by a lift-off method to create a piezoelectric actuator (the thickness of each layer is shown in FIG. 3).

FIG. 1 shows the results of measuring the bipolar polarization-electric field characteristics (Pr-E hysteresis characteristics) of the piezoelectric actuator thus obtained. As shown in FIG. 1, the obtained Pr-E hysteresis characteristics were asymmetrical with respect to the y axis indicating the polarization and are biased toward the positive field side, and the bias rate was 76%. In this case, the coercive electric field was 41.6 kV/cm in the positive direction and 5.8 kV/cm in the negative direction.

Thereupon, the bipolar electric field-displacement characteristics of the piezoelectric actuator thus created were measured, and the hysteresis shown in FIG. 2 was obtained. As shown in FIG. 2, the Nb-PZT film was confirmed to have high linearity on the negative field side, and furthermore, was confirmed to have high linearity even at voltages below the coercive field on the positive side.

Embodiment of Manufacturing Process of rf-MEMS Switch

An rf-MEMS switch was manufactured by the following process using a piezoelectric film having the characteristics shown in FIGS. 1 and 2. FIGS. 4A to 4I show step diagrams of a manufacturing process.

(Step 1)

Figure 4A:
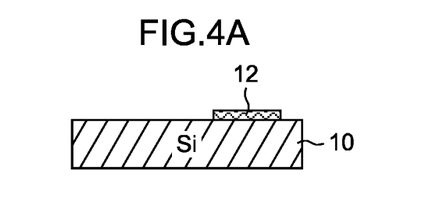
FIGS. 4A to 4I are step diagrams showing a manufacturing process of an rf-MEMS switch relating to an embodiment of the present invention.

An electrode 12 for a high-frequency (rf) signal wire was patterned on a silicon (Si) wafer 10 (FIG. 4A). This silicon wafer 10 corresponds to the "base substrate" and the "first silicon wafer", and the electrode 12 corresponds to the "fixed electrode".

(Step 2)

Figure 4B:
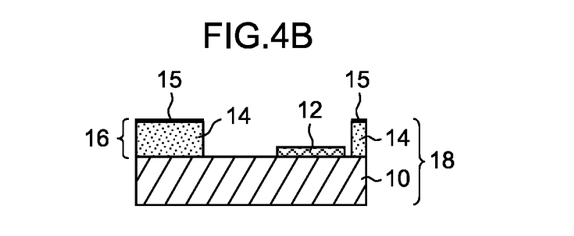

Thereupon, photoresist (for example, product name: SU-8) 14 was formed to a thickness of 5 μm as a bridge on the silicon wafer 10, and Au—Sn 15 was formed thereon and then patterned to form a column 16 (FIG. 4B). The wafer (structure) obtained in step 2 above was taken as the "lower wafer" 18.

(Step 3)

Figure 4C:
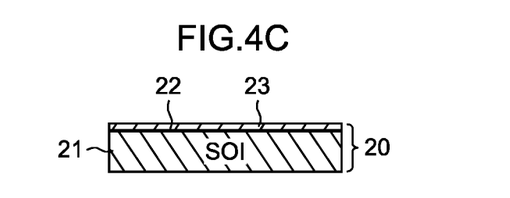

Meanwhile, separately from steps 1 and 2 described above, an SOI wafer 20 was prepared as a substrate, as shown in FIG. 4C. The SOI wafer 20 had a structure in which an active layer (Si layer) 23 was stacked via a thermal oxide film ($SiO_2$) 22 on the silicon layer 21. In the case of the present embodiment, the thickness of the active layer 23 was 5 μm. The SOI wafer 20 with the thermal oxide film 22 having an active layer 23 with a thickness of 5 μm was prepared as a substrate. This SOI wafer 20 is a member corresponding to a "second silicon wafer".

(Step 4)

Figure 4D:
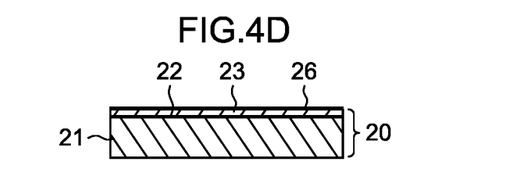

TiW (film thickness 50 nm) and Ir (film thickness 150 nm) were formed in a laminated structure as a lower electrode 26 of the piezoelectric body (PZT) onto the active layer 23 of the SOI wafer 20 (FIG. 4D).

(Step 5)

Figure 4E:
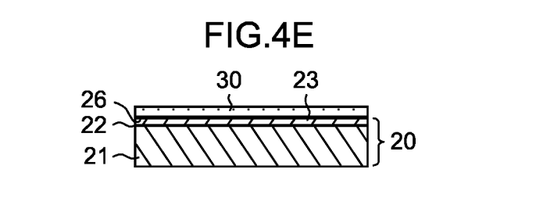

Thereupon, a piezoelectric body (PZT) film 30 having the piezoelectric characteristics shown in FIGS. 1 and 2 was formed to a thickness of 4 μm on the lower electrode 26 (FIG. 4E). The piezoelectric film 30 was formed by sputtering. The state of polarization of the piezoelectric film 30 was such that the upper side in FIG. 4E (the TiW/Au electrode side) was positively polarized and the lower side (TiW/Ir electrode side) was negatively polarized. If the direction from the positive to negative polarization charge is defined as the "polarization direction", then the polarization direction here was "downward".

(Step 6)

Figure 4F:
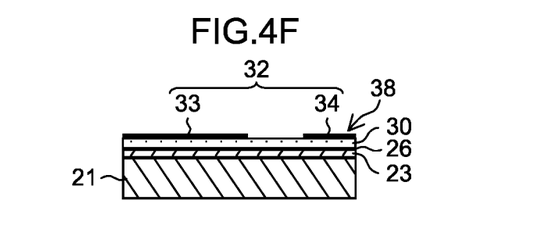

Next, TiW (film thickness 50 nm) and Au (film thickness 150 nm) were layered as an electrode 32 on top of the piezoelectric film 30, and by patterning, a portion thereof was formed into an electrode 33 for PZT driving and a portion was formed into an electrode 34 for an rf signal wire (FIG. 4F). The wafer structure obtained by this step 6 is taken as an "upper wafer" 38. The procedure (steps 3 to 6) for manufacturing the upper wafer 38 and the procedure (steps 1 to 2) for manufacturing the lower wafer 18 can be carried out independently, and therefore the upper wafer 38 and the lower wafer 18 may be manufactured in any order.

(Step 7)

Figure 4G:
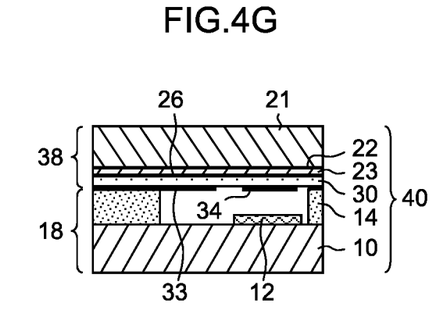

Thereupon, the lower wafer 18 and the upper wafer 38 were mutually superimposed and bonded together as shown in FIG. 4G, thereby forming one wafer 40.

In this case, the upper wafer 38 was turned upside down from the state in FIG. 4F, and with the electrodes 32 (33, 34) facing downwards (toward the lower wafer 18), the upper wafer 38 was bonded to the lower wafer 18. In other words, in the bonded state in FIG. 4G, the electrode having reference numeral 33 which was disposed on the lower face of the piezoelectric film 30 became the lower electrode and the electrode having reference numeral 26 which was disposed on the upper face of the piezoelectric film 30 became the upper electrode. In this case, the direction of polarization of the piezoelectric film 30 was "upward".

(Step 8)

Figure 4H:
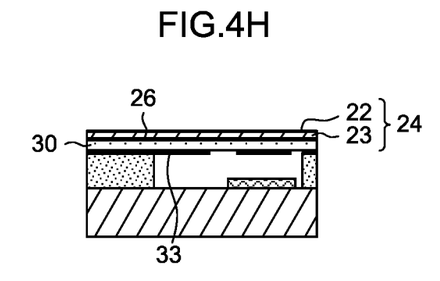

Next, the Si layer 21 of the upper wafer 38 (which corresponds to a sacrificial layer) was removed by wet etching, to leave only the thermal oxide film 22 and the active layer 23 (FIG. 4H). A diaphragm 24 was constituted by this remaining thermal oxide film 22 and active layer 23.

(Step 9)

Figure 4I:
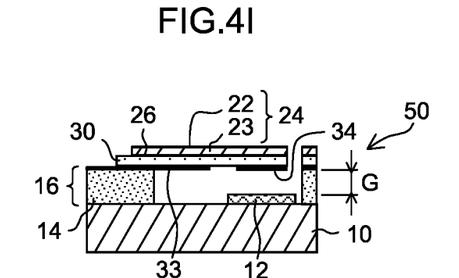

Moreover, a portion of the active layer 23 was removed by dry etching, in such a manner that the piezoelectric film 30 and the diaphragm 24 were supported by a cantilever structure (FIG. 4I). The column 16 made from the resist 14 functioned as a support base providing a cantilever support for the movable part constituted by the piezoelectric film 30 and the diaphragm 24, as well as functioning as a wall member (spacer member) which formed a space (cavity) 44 ensuring a gap G between the electrodes (12, 34). The distance (gap G) between the electrodes (12, 34) of the switch contact is 20 μm or less, desirably, 10 μm or less, and more desirably, 5 μm or less.

In this way, an rf-MEMS switch 50 was manufactured in which a movable electrode indicated by reference numeral 34 opposed a fixed electrode indicated by reference numeral 12, via a space (gap) 44.

(Step 10)

Finally, the resist (not illustrated) adhering to the active layer 23 in step 9 was removed by a remover and then washing was carried out. The steps of cleaning, and the like, are not limited to this step 10, and they may be carried out in other steps as necessary, but description thereof is omitted here.

The rf-MEMS switch 50 manufactured by the procedure described above performed an on/off switching operation by contacting and separating a movable electrode 34 with respect to a fixed electrode 12, by means of piezoelectric driving.

In implementing the present invention, the steps for manufacturing a switch (manufacturing method) and the structure of the switch are not limited to the embodiments described above.

The switch manufacturing steps and the switch structure may be other than those described above.

Operation of rf-MEMS Switch

Figure 5:
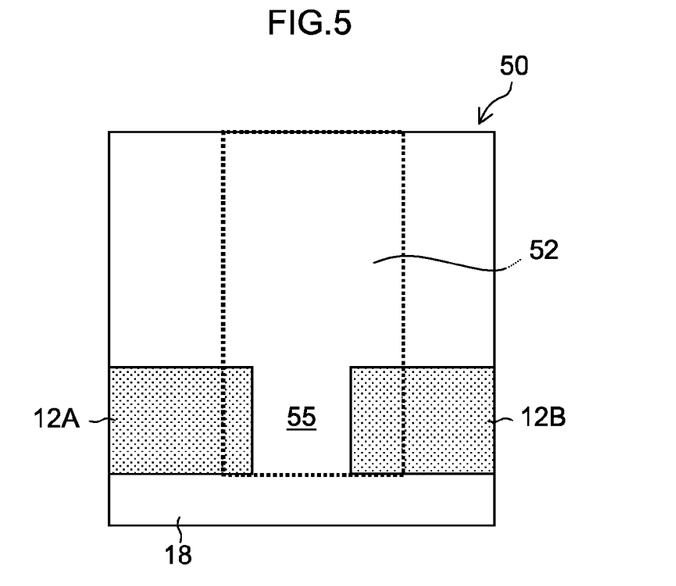
FIG. 5 is a plan diagram of an rf-MEMS switch manufactured by the manufacturing process in FIGS. 4A to 4I, as viewed from above.

FIG. 5 is a plan diagram of the rf-MEMS switch 50 viewed from above. The portion indicated by the dotted line and labeled with reference numeral 52 in FIG. 5 is a cantilever portion (corresponding to the "movable part") which is displaced by piezoelectric driving. An electrode (not shown in FIGS. 4A to 4I; indicated by reference numeral 34 in other drawings, called "movable electrode" below) is provided below the cantilever 52.

Furthermore, signal electrodes 12A and 12B are disposed via a prescribed insulating gap 55 on top of the lower wafer 18 which opposes the cantilever 52. The electrodes 12A and 12B are signal lines which pass a high-frequency (RF) signal (hereinafter, these lines are called "rf signal lines"), and by driving the cantilever 52, it is possible to switch between coupling (on) and separation (off) of the signal lines (electrodes 12A and 12B).

More specifically, when the cantilever 52 is raised upward, then the movable electrode 34 separates form the electrodes 12A and 12B, the connection between the electrodes 12A and 12B is released (open-state between the contacts), and the switch assumes an "off" (non-conducting) state. On the other hand, when the cantilever 52 is moved downward and the movable electrode 34 makes contact with the electrodes 12A and 12B, then the electrodes are connected together and the switch assumes an "on" (conducting) state.

This rf-MEMS switch 50 was driven by a combination of the applied voltages shown in Table 1. Here, of the electrodes which drive the piezoelectric body (PZT), the Ir electrode (reference numeral 26) on the side of the diaphragm 24 in FIG. 4I (the Si wafer side of the upper surface) is called the "upper electrode", and the Au electrode (reference numeral 33) on the side which faces the rf signal lines (12A and 12B) is called the "lower electrode". In the case of the switch structure shown in FIG. 4I, when the piezoelectric film 30 is compressed in the d31 direction, the switch turns on, and the piezoelectric film 30 is stretched in the d31 direction, the switch acts so as to move away from the electrode 12.

TABLE 1

|  |  | Upper Electrode | | |
| --- | --- | --- | --- | --- |
|  |  | Positive | Earthed | Negative |
| Lower Electrode | Positive | — | Prevention of sticking (up to 80% of coercive electric field) | Prevention of sticking (up to 80% of coercive electric field) |
|  | Earthed | ON | — | Prevention of sticking (up to 80% of coercive electric field) |
|  | Negative | ON | ON | — |

As shown in Table 1, if the lower electrode is earthed and a positive voltage is applied to the upper electrode, then the cantilever 52 is displaced downward and the switch turns on. Furthermore, if a negative voltage is applied to the upper electrode in a state where the lower electrode is earthed, then the cantilever 52 is displaced in the upward direction. In this case, the value of the negative voltage applied to the upper electrode is set to a value at which the electric field in the piezoelectric film becomes equal to or lower than the value of the coercive electric field (Ec+), and desirably is set to a voltage value which produces an electric field of 80% or less of the coercive electric field (Ec+). The driving operation performed by this application of a negative voltage is an operation of moving the cantilever 52 in a direction away from the rf signal lines (electrodes 12A and 12B), and thus provides an effect of preventing sticking. Drive modes which are described as "Prevention of sticking" in Table 1 were modes where upward movement of the cantilever was confirmed by a laser Doppler displacement meter. Furthermore, it was also confirmed that the respective operations are satisfactory.

The mode of applying a drive voltage is not limited to that described above. It is possible to perform similar driving by means of a combination of electric potentials which can achieve an applied electric field similar to that described above. For example, the following kinds of mode are also possible. More specifically, if the upper electrode is earthed and a negative voltage is applied to the lower electrode, then the cantilever 52 is displaced in the downward direction and the switch switches on. Furthermore, if a positive voltage is applied to the lower electrode with the upper electrode in an earthed state, then the cantilever 52 is displaced in the upward direction. In this case, the value of the positive voltage applied to the lower electrode is set to a value at which the electric field in the piezoelectric film becomes not greater than the value of the coercive electric field (Ec+), and desirably is set to a voltage value which produces an electric field of 80% or less of the coercive electric field (Ec+). The driving operation performed by this application of a positive voltage is an operation of moving the cantilever 52 in a direction away from the rf signal lines, and thus provides an effect of prevention of the sticking.

Apart from this, by applying a negative voltage to the lower electrode and a positive voltage to the upper electrode, the cantilever 52 is displaced in the downward direction and the switch switches on. Conversely, if a positive voltage is applied to the lower electrode and a negative voltage is applied to the upper electrode, then the cantilever 52 is displaced in the upward direction and the sticking can be prevented. In this case, the potential difference between the electrodes is set to a value at which the electric field in the piezoelectric film becomes not greater than the value of the coercive electric field (Ec+), and desirably is set to a potential difference which produces an electric field of 80% or less of the coercive electric field (Ec+).

As described above, the method of driving the piezoelectric film may employ the various combinations shown in Table 1. It is possible to use any of the combinations by selecting an appropriate drive circuit.

Of a plurality of rf-MEMS switches manufactured by the manufacturing process shown in FIGS. 4A to 4I, a portion of the devices had an initial state where the rf signal line was switched on, and there were also devices where the cantilever in the PZT portion was adhering to the lower wafer.

When the piezoelectric bodies of the devices experiencing such adherence were driven by a voltage combination having a "prevention of sticking" effect in Table 1, this adherence (sticking) was resolved. In the case of the piezoelectric film according to the present embodiment, a voltage of approximately 7 V (70% of the coercive electric field) was applied. After resolving sticking in this way, the devices could be driven satisfactorily.

By carrying out driving for preventing sticking in the devices, during inspection of the devices, subsequent occurrence of sticking was prevented. In this way, sticking can be resolved in pre-shipment inspection and normal (shippable) elements can be achieved, thus making it possible to improve production yield.

In a case where devices free of sticking are obtained by carrying out a device inspection step, it can be envisaged that sticking may occur due to the rf signal lines remaining on permanently for some reason when the devices are actually driven at a subsequent time. In such cases, it is possible to separate the sticking by applying a voltage having a sticking prevention effect as described above (in the present embodiment, a voltage of approximately 7 V) to a device which has become stuck.

An embodiment is described above in relation to a unimorph type of actuator which causes a diaphragm to bend by means of distortion of a piezoelectric body in the d31 direction, and desirably the piezoelectric constant d31 (pm/V) of the piezoelectric body is high. Desirably, the piezoelectric constant is 100 pm/V or higher, and more desirably 200 pm/V or higher. This is because if the piezoelectric constant is 100 pm/V or lower, then there is a possibility that the force for preventing sticking according to an embodiment of the present invention will not be generated adequately.

Relationship Between Applied Voltage and Coercive Electric Field During Sticking Prevention Operation The relationship between the ratio of the voltage applied in driving to resolve device sticking, to the coercive electric field, and the sticking prevention effect was investigated. In an evaluation experiment, the sticking prevention effect was investigated using a piezoelectric film having the characteristics shown in FIG. 1, by applying a voltage so as to drive the piezoelectric film toward the positive side of the hysteresis, and thus driving the cantilever in a direction away from the switch electrode. The results are shown in Table 2.

TABLE 2

| Ratio of drive voltage with respect to coercive electric field | Sticking prevention effect |
|---|---|
| 150% | Poor |
| 100% | Average |
| 80% | Good |
| 70% | Good |
| 50% | Good |
| 30% | Good |
| 10% | Average |
| 0% | Poor |

Devices to which a voltage producing an applied electric field greater than the coercive electric field was applied (a ratio of 150% with respect to the coercive electric field; in this case, a voltage corresponding to an electric field of 52.5 kV/cm) showed no sticking prevention effect and were assigned an evaluation of "Poor".

In the case of an electric field equal to the coercive electric field (a ratio of 100% with respect to the coercive electric field), although a sticking effect was confirmed, as this driving was repeated and driving of the cantilever in a direction away from the electrode proceeded, the amount of displacement gradually declined; therefore although there was a sticking prevention effect, reliability was somewhat degraded and the evaluation was "Average".

When the ratio with respect to the coercive electric field was 80% (in the present embodiment, approximately 28 kV/cm), a sticking prevention effect was observed, the situation upon repeated operation was also satisfactory, and a "Good" evaluation was assigned. When the device was driven at 10% of the coercive electric field (approximately 3.5 kV/cm), there were some samples which produced sticking and some samples which did not produce sticking, and hence a satisfactory effect was not obtained and the evaluation was "Average". At 0%, the cantilever did not move at all and no prevention of sticking was achieved, and therefore the evaluation was "Poor".

From the results given above, when driving in order to prevent sticking, desirably, the device is driven in the range of 10% to 100% of the coercive electric field and more desirably, the device is driven in the range of 30% to 80% of the coercive electric field.

"Bias" in Pr-E Hysteresis Characteristics

The "bias" of the Pr-E hysteresis characteristics with respect to the electric field shown in FIG. 1 is defined, for example, by focusing on the difference between the absolute value of the coercive electric field on the positive field side and the absolute value of the coercive electric field on the negative field side. In the case of Pr-E hysteresis characteristics which are biased further toward the positive field side, the greater the bias, it is possible to determine a "bias rate" by the following formula, from the coercive electric field $Ec1$ on the negative field side and the coercive electric field $Ec2$ on the positive field side.

$$(Ec2+Ec1)/(Ec2-Ec1) \times 100 (\%)$$

In a piezoelectric body having Pr-E hysteresis characteristics biased toward the negative field side, the bias rate is the absolute value of the value obtained by this formula.

The method of driving an actuator element according to an embodiment of the present invention is especially desirable for application to an actuator including a piezoelectric body having Pr-E hysteresis with the bias rate of 20% or greater, and the higher the bias rate, the greater the beneficial effects achieved. The bias rate of the Pr-E hysteresis shown in FIG. 1 is 76%.

Modification Example

In implementing the present invention, the material of the piezoelectric body, the electrode material, film forming conditions, film thickness, drive voltage, and other conditions are not limited to those of the embodiments described above, but rather the invention can be implemented under various conditions.

Furthermore, the embodiments described above relate to a switch structure in which a plurality of fixed electrodes (12A, 12B) are arranged on a base substrate, and current is passed between the plurality of fixed electrodes by bringing the movable electrode 34 into contact with this plurality of fixed electrodes, but in implementing embodiments of the present invention, it is also possible to adopt a switch structure in which a movable electrode is contacted with and separated from one fixed electrode.

Moreover, in the embodiment described above, a cantilever beam structure is given as an example, but the range of application of the present invention is not limited to this and can also be applied to a dual-support structure or a diaphragm structure.

Composition of Piezoelectric Film

The piezoelectric film which can be used in implementing an embodiment of the present invention may be a piezoelectric film made of one type or a plurality of types of perovskite oxide, which are expressed by the following General Formula (P) (the film may also include unavoidable impurities). This piezoelectric film can be formed on the substrate by sputtering using a plasma. This piezoelectric film (General Formula (P)) has piezoelectric characteristics according to which the polarity of the coercive electric field having a smaller absolute value is negative, and the Pr-E hysteresis is biased toward the positive field side.

$$A_a B_b O_3 \qquad \text{General Formula (P)}$$

In General Formula (P), "A" represents A site element of which the main component is Pb; "B" represents B site element, at least one type of element selected from the group consisting of Ti, Zr, V, Nb, Ta, Cr, Mo, W, Mn, Sc, Co, Cu, In, Sn, Ga, Zn, Cd, Fe and Ni; and "O" represents oxygen. A case where a>1.0 and b=1.0 is standard, but these figures may deviate from 1.0 within a range which enables a perovskite structure to be obtained.

The perovskite oxide represented by the General Formula (P) described above may be lead titanate, lead titanate zirconate (PZT), lead zirconate, lead zirconate titanate niobate, or the like. The piezoelectric film may be a mixed crystalline film (mixed crystal system) of a perovskite oxide as represented by the General Formula (P) stated above.

Furthermore, in implementing an embodiment of the present invention, a piezoelectric film made of one type or a plurality of types of perovskite oxide represented by the General Formula (P-1) below is especially desirable (the piezoelectric film may include unavoidable impurities).

$$Pb_a(Zr_{b1}Ti_{b2}X_{b3})O_3 \qquad \text{General Formula (P-1)}$$

In Formula (P-1), X represents at least one type of metal element selected from the V and VI element groups. a>0, b1>0, b2>0, and b3>0 are satisfied. A case where a>1.0 and b1+b2+b3=1.0 is standard, but these figures may deviate from 1.0 within a range which enables a perovskite structure to be obtained.)

The perovskite oxide represented by the General Formula (P-1) above is lead zirconate titanate (PZT) if b3=0, and if b3>0, then an oxide in which a part of the B site of PZT is substituted with X which is at least one type of metal element selected from the Group V and Group VI elements.

X may be any metal element from Group VA, Group VB, Group VIA and Group VIB, and desirably, is at least one type of element selected from a group consisting of V, Nb, Ta, Cr, Mo and W.

A piezoelectric film made of PZT oxide including a dopant which is represented by the General Formula (P-1) has a large bias rate to the positive field side in the Pr-E hysteresis characteristics, and therefore the beneficial effects of using the driving method of the piezoelectric actuator according to the present invention can be achieved successfully.

Furthermore, the larger the amount of lead, the greater the bias rate of the piezoelectric film 30 made of perovskite oxide represented by General Formulas (P) and (P-1). In the perovskite oxide represented by General Formulas (P) and (P-1), if the composition a of the lead is in the range of $1.02 < a \leq 1.3$, then the bias rate is 20% or above, and therefore it is possible successfully to obtain the beneficial effects achieved by using the method of driving a piezoelectric actuator according to the present invention described above.

Consequently, in a piezoelectric film 30 comprising a perovskite oxide represented by General Formula (P-1), the greater the lead content, the greater the beneficial effects obtained by using the method of driving a piezoelectric actuator according to the present invention described above.

As stated previously, a piezoelectric film made of a perovskite oxide represented by the General Formula (P) and (P-1) given above has a high piezoelectric distortion constant (piezoelectric strain constant; d31 constant), and therefore the piezoelectric actuator (actuator element) including this piezoelectric film has excellent displacement characteristics.

Furthermore, as described in relation to FIG. 2, the piezoelectric actuator having a piezoelectric film comprising a perovskite oxide represented by the General Formulas (P) and (P-1) has voltage-displacement characteristics with excellent linearity in the range of the drive voltage.

The description given above relates to PZT, but when any material having biased hysteresis in the properties of the piezoelectric body is used, similar action and beneficial effects can be obtained. In implementing the present invention, it is possible to use a material composition other than the composition described above, or to use a lead-free piezoelectric body, or the like.

Further Application Examples

An actuator element using a piezoelectric film having the piezoelectric characteristics described above is able to produce a large amount of displacement compared to other actuators and therefore is not restricted to a switch element, but rather can be used widely in applications of various kinds, such as an optical modulating element, and can also be employed in piezoelectric thin film elements and MEMS devices of various kinds.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. An actuator element comprising:
a piezoelectric body;
a pair of electrodes mutually opposing to each other via the piezoelectric body;
a diaphragm to which the piezoelectric body sandwiched between the pair of electrodes is bonded; and
a base substrate arranged to oppose a movable part including the piezoelectric body and the diaphragm, the movable part being displaced in a direction toward the base substrate by application of a drive voltage to the pair of electrodes, wherein:
polarization (Pr)-electric field (E) hysteresis characteristics of the piezoelectric body are biased with respect to an electric field;
by application of a voltage in an opposite direction to the drive voltage, to the pair of electrodes, the movable part is displaced in a direction away from the base substrate; and
wherein, of a coercive electric field on a positive electric field side and a coercive electric field on a negative field side in the Pr-E hysteresis characteristics, when a coercive electric field in an electric field direction at a time of driving by application of the drive voltage is represented by Ec_a and a coercive electric field in an electric field direction at a time of the movable part being displaced in the direction away from the base substrate by application of the voltage in the opposite direction is represented by Ec_b, then |Ec_b|>|Ec_a| is established;
the drive voltage, applied when driving to displace the movable part in the direction toward the base substrate is performed, produces an electric field not less than the coercive electric field |Ec_a| of the piezoelectric body; and
the voltage applied when the movable part is displaced in the direction away from the base substrate produces an electric field that is not greater than 80% of the coercive electric field |Ec_b| of the piezoelectric body and not less than 30% of the coercive electric field |Ec_b| the piezoelectric body.

2. The actuator element as defined in claim 1, wherein at the time of the movable part being displaced in the direction away from the base substrate, a voltage obtained by switching a polarity of the drive voltage is applied in such a manner that the movable part is displaced by utilizing extension, in the d31 direction, of the piezoelectric body.

3. The actuator element as defined in claim 1, wherein of the pair of electrodes, defining the electrode on a base substrate side as a lower electrode and defining the electrode on an opposite side thereto as an upper electrode, a direction of the voltage applied to the pair of electrodes at a time of the movable part being displaced in the direction away from the base substrate is determined in such a manner that an electric field in a direction from the lower electrode toward the upper electrode is produced.

4. The actuator element as defined in claim 1, wherein voltage-displacement hysteresis characteristics representing a relationship between a voltage applied to the piezoelectric body and a displacement of same include a linear region showing a substantially proportional relationship in a continuous range extending from a negative voltage side to a positive voltage side, and a direction of the displacement reverses in the continuous linear region.

5. The actuator element as defined in claim 1, wherein the piezoelectric body is formed of one type or a plurality of types of perovskite oxide represented by General Formula (P-1) below:

$$Pb_a(Zr_{b1}Ti_{b2}X_{b3})O_3 \qquad (P-1)$$

where, X represents at least one type of metal element selected from the V and VI groups; a>0, b1>0, b2>0, and b3>0 are established; a case where $a \geq 1.0$ and b1+b2+b3=1.0 are established is standard, while these figures may deviate from 1.0 within a range allowing a perovskite structure to be obtained; and the piezoelectric body may include unavoidable impurities.

6. A method of driving the actuator element as defined in claim 1, comprising the steps of:

applying the drive voltage to produce the electric field not less than the coercive electric field |Ec_a| of the piezoelectric body, when the movable part is driven in the direction toward the base substrate; and applying the voltage to produce the electric field not greater than the coercive electric field |Ec_b| of the piezoelectric body, when the movable part is displaced in the direction away from the base substrate.

7. A device inspection method comprising the step of, when a device inspection of the actuator element as defined in claim 1 is carried out, applying the voltage in the opposite direction to the drive voltage in such a manner that the movable part is displaced in the direction away from the base substrate.

8. A MEMS switch comprising the actuator element as defined in claim 1, wherein:

a fixed electrode is provided on the base substrate;

a movable electrode which makes contact with and separates from the fixed electrode is provided on a portion of the movable part; and a distance between the fixed electrode and the movable electrode is not greater than 20 μm.

9. A method of manufacturing the actuator element as defined in claim 1, comprising a wet etching step or cleaning step in which a liquid can infiltrate between the movable part and the base substrate.

10. A method of manufacturing the actuator element as defined in claim 1, comprising a bonding step of bonding together at least two silicon wafers including a first silicon (Si) wafer that is to be the base substrate and a second silicon (Si) wafer on which a film of the piezoelectric body is formed, wherein the film of the piezoelectric body is formed on the second silicon wafer before the bonding step, and the second silicon wafer after forming this film is bonded to the first silicon wafer.

11. The actuator element as defined in claim 1, wherein |Ec_b|>5|Ec_a|.

12. The actuator element as defined in claim 1, wherein the movable part is supported by a cantilever structure.

13. The method as defined in claim 6, further comprising a step of resolving adherence when the movable part experiences adherence to the base substrate, said step resolving the adherence by displacing the movable part in the direction away from the base substrate by applying the voltage to produce the electric field that is not greater than 80% of the coercive electric field |Ec_b| of the piezoelectric body and not less than 30% of the coercive electric field |Ec_b| of the piezoelectric body.

* * * * *